United States Patent [19]

Opas

[11] Patent Number: 4,591,800
[45] Date of Patent: May 27, 1986

[54] LINEAR POWER AMPLIFIER FEEDBACK IMPROVEMENT

[75] Inventor: George F. Opas, Park Ridge, Ill.

[73] Assignee: Motorola, Inc., Schaumburg, Ill.

[21] Appl. No.: 656,552

[22] Filed: Oct. 1, 1984

[51] Int. Cl.[4] ............................ H03F 1/32; H03F 1/26
[52] U.S. Cl. ...................................... 330/86; 330/293; 330/149
[58] Field of Search ................. 330/86, 136, 149, 293

[56] References Cited

U.S. PATENT DOCUMENTS

| | | | |
|---|---|---|---|
| 3,327,063 | 6/1967 | Remley | 179/15.55 |
| 3,486,128 | 12/1969 | Lohrmann | 330/40 |
| 3,668,533 | 6/1972 | Fish et al. | 328/168 |
| 3,714,622 | 1/1973 | Wilhelmsen | 340/16 |
| 3,900,823 | 8/1975 | Sokal et al. | 330/149 |
| 4,237,555 | 12/1980 | Dishal | 455/108 |
| 4,412,337 | 10/1983 | Bickley et al. | 375/60 |

FOREIGN PATENT DOCUMENTS

| | | |
|---|---|---|
| 2741435 | 3/1978 | Fed. Rep. of Germany . |
| 3004189 | 8/1981 | Fed. Rep. of Germany . |
| 1246209 | 9/1971 | United Kingdom . |
| 2107540 | 4/1983 | United Kingdom . |
| 733082 | 3/1973 | U.S.S.R. . |

OTHER PUBLICATIONS

Kahn, L. R., "Single-Sideband Transmission by Envelope Elimination and Restoration," Proceedings of the I.R.E., vol. 40, Jul., 1952, pp. 803-806.
Bruene, W. B., "Distortion Reducing Means for Single-Sideband Transmitters," Proceedings of the I.R.E., vol. 44, Dec., 1956, pp. 1760-1765.
Arthanayake, T. and Wood, H. B., "Linear Amplification Using Envelope Feedback," Electronic Letters, vol. 7, No. 7, Apr. 8, 1971, pp. 145-146.
Petrovic, V. and Gosling, W., "A Radically New Approach to SSB Transmitter Design," University of Bath, England, Colloquium and Exhibition, Sep. 18, 1980.

Primary Examiner—James B. Mullins
Assistant Examiner—G. Wan
Attorney, Agent, or Firm—Donald B. Southard; Edward M. Roney

[57] ABSTRACT

An improvement to a linear power amplifying system is disclosed which maintains the DC balance of the envelope feedback loop under adverse conditions, thereby improving the accuracy of the system. The improvement is realized through the addition of two differential amplifier stages to the feedback loop. A first differential amplifier 103 is added to the balanced outputs of the synchronous envelope detector 102, which is comprised of an active balanced modulator/demodulator device, to correct for the common-mode DC drift of the detector. An auxiliary feedback loop, comprised of a second differential amplifier 104 and a low-pass filter, compares the average DC value of the envelope error signal to a system reference voltage $V_R$, and produces a loop gain error signal which corrects for variations in envelope feedback loop gain. The improvement provides envelope modulation transmitters with a substantial reduction in adjacent-channel interference and lower on-channel distortion.

31 Claims, 9 Drawing Figures

LINEAR POWER AMPLIFIER FEEDBACK IMPROVEMENT

BACKGROUND OF THE INVENTION

1. Field of the Invention

The present invention generally relates to improvements in linear power amplifier envelope feedback systems, particularly those adapted for use in radio frequency envelope modulation transmitters. More specifically, the present invention relates to envelope feedback loop correction circuitry providing an improved means for reducing power amplifier nonlinearities by maintaining feedback loop balance.

2. Description of the Prior Art

Envelope modulation transmission, i.e. amplitude modulation (AM) and single-sideband (SSB), has been proposed to be a more spectrally efficient modulation scheme than conventional frequency modulation (FM) for radio frequency communications, particularly for land mobile radio applications. There are, however, a number of technical obstacles which must be resolved before this maximum spectrum utilization advantage can be realized. One of the most critical aspects of an envelope modulation system is the reduction of distortion and spurious outputs generated in the transmitter power amplifier. Customarily, transmitters for envelope modulation systems operate as class A or class AB amplifiers in order to achieve linearity, which consequently results in low power efficiency. Although the present invention is not specifically concerned with power efficiency, the proposed solutions to that problem are the basis of the prior art.

One proposed solution to the efficiency problem is the "envelope elimination and restoration" (EER) technique developed by Kahn, in which the SSB signal is initially stripped of its envelope—the remaining phase information being amplified in a conventional class C amplifier—and finally the envelope is remodulated back onto the signal with a conventional amplitude modulator. Even though the resulting waveform can be shown theoretically to be a perfect replication of the original SSB signal, this technique, when implemented, was only moderately successful. The EER transmitter, although quite efficient, was only a few decibels better than linear amplifiers with respect to third-order intermodulation (IM) products, since the high level modulators used for restoring the envelope in the final stage suffered from both nonlinearity of amplitude modulation and spurious phase modulation (AM-to-PM conversion).

The prior work—although directed towards improving efficiency—introduced the concept of resolving generalized modulation on a carrier into amplitude and phase components. In order to improve the spectral purity attainable with the EER approach, Bruene proposed the technique of adding negative feedback in such a way as to cause the envelope of the transmitter output to track the envelope of the AM input signal. FIG. 1 illustrates this approach, wherein envelope feedback system 10 includes input envelope detector 14 which provides an audio frequency (AF) reference to differential amplifier 13, attenuator 15 and output envelope detector 16 which provide an AF feedback to the differential amplifier 13, amplifier 13 produces an envelope error signal to power amplifier control stage 12 which, in turn, instantaneously varies the gain of power amplifier 11 so as to minimize the output distortion. This scheme resulted in a significant improvement in third-order IM products and established the envelope feedback technique as a viable method of reducing both in-band distortion and out-of-band spurious products.

With continued refinement of the envelope feedback technique, it became evident that further improvement in IM performance was limited by spurious phase modulation in the power amplifier. Bradshaw, in British Pat. No. 1,246,209, proposed using negative feedback to correct for this AM-to-PM conversion by implementing a phase shifting network immediately before the amplitude modulator. The phase of the input signal was compared to the phase of the output, and the difference was used to control the phase shifter in such a manner as to reduce phase error. This approach, which has been used in subsequent envelope modulation transmitters, requires the use of a phase-control feedback loop in addition to the envelope-control feedback loop previously discussed.

A significant limitation in envelope tracking accuracy, and ultimately in power amplifier system linearity, is inherent in the two envelope detector concept proposed by Bruene. The two envelope detectors (14 and 16 of FIG. 1) must be precisely matched to prevent mis-tracking between their nonlinear responses. In practice, the two envelope detectors cannot be matched to track closely enough over the entire operating range, thereby causing distortion in the transmitter output. Further improvement in the accuracy of the envelope-control feedback loop concept was realized by Sokol et al. in U.S. Pat. No. 3,900,823, in which a single envelope detector was utilized. FIG. 2 illustrates envelope feedback system 20 employing this technique of subtracting the input RF reference signal from the attenuated output RF feedback signal in RF subtractor 23 and envelope detecting the resulting RF error signal in synchronous envelope detector 22 to provide the aforementioned envelope error signal. The RF subtractor must provide a linear transfer function to realize the improved tracking accuracy, but this is, of course, much more readily achieved than two mutually tracking envelope detectors. Moreover, active synchronous envelope detectors remain linear at low input drive levels, whereas passive envelope detectors, such as diode detectors, do not. This attribute aids in maintaining a higher level of corrective feedback under low drive conditions. It is apparent that the two inputs to envelope comparison mechanism 21 must be in phase for proper system operation; accordingly, this function is accomplished by the supplementary phase-control feedback loop previously described.

A further problem, concerning envelope feedback loop accuracy, arises upon the implementation of envelope comparison mechanism 21 of FIG. 2. Since DC coupling is required in the envelope feedback loop, the DC operating point of the loop must remain very stable. DC bias point stability is achieved through the use of a voltage regulated and temperature compensated system reference voltage. Additionally, the DC drift of the component parts of the loop must be negligible. Unfortunately, this is not the case with commonly available devices. Active synchronous envelope detectors exhibit an unacceptable level of common-mode DC drift due to temperature and voltage variations. Moreover, system balance is also a function of the overall gain of the feedback loop. Therefore, any slight variation in gain of the loop components—due to changes in temperature, varying supply voltage, or aging—will upset the DC balance of the system. Accurate DC balance of the envelope feedback loop in a linear power amplifier system is necessary to achieve acceptable distortion and spurious performance.

A need, therefore, exists for improvement in linear power amplifying systems which maintain the DC balance of the feedback loop under adverse conditions, thereby providing an improved means for reducing power amplifier nonlinearities.

SUMMARY OF THE INVENTION

Accordingly, a principal object of the present invention is to provide an improved feedback system for a linear power amplifier which effectively maintains system balance.

A more particular object of the present invention is to provide an improved feedback system for a linear power amplifier which corrects for common-mode DC drift of the synchronous envelope detector.

A further object of the present invention is to provide an improved feedback system for a linear power amplifier which compensates for variations in gain of the feedback loop components.

In accordance with the present invention, there is provided an improved linear power amplifying system which exhibits reduced levels of distortion and spurious output by effectively maintaining DC balance of the envelope feedback loop. The improvement is realized through the addition of two differential amplifier stages to the envelope feedback loop.

The first differential amplifier stage, or common-mode rejection amplifier, functions to correct for the common-mode DC drift of the synchronous envelope detector. The balanced outputs of the synchronous envelope detector, which is comprised of an active balanced modulator/demodulator device, are fed as inputs to a first differential amplifier which is configured to reject common-mode signals, thereby eliminating any common-mode DC drift from the synchronous envelope detector. A first low-pass filter is coupled to the output of the differential amplifier to provide loop filtering for the envelope error signal. A temperature compensated system reference voltage is applied to the differential amplifier to provide a stable DC system operating point.

The second differential amplifier stage, or loop gain error amplifier, functions to correct for any gain changes in the individual components of the feedback loop. The DC component of the envelope error signal from the first differential amplifier is obtained by filtering, and fed as one input to a second differential amplifier, the other input being the system reference voltage. The output of this second differential amplifier is applied as a loop gain error signal to the power amplifier control stage which responds by adjusting the gain of the envelope feedback loop. A loop gain control voltage is coupled to the second differential amplifier to determine nominal loop gain.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENTS

Figure 1:
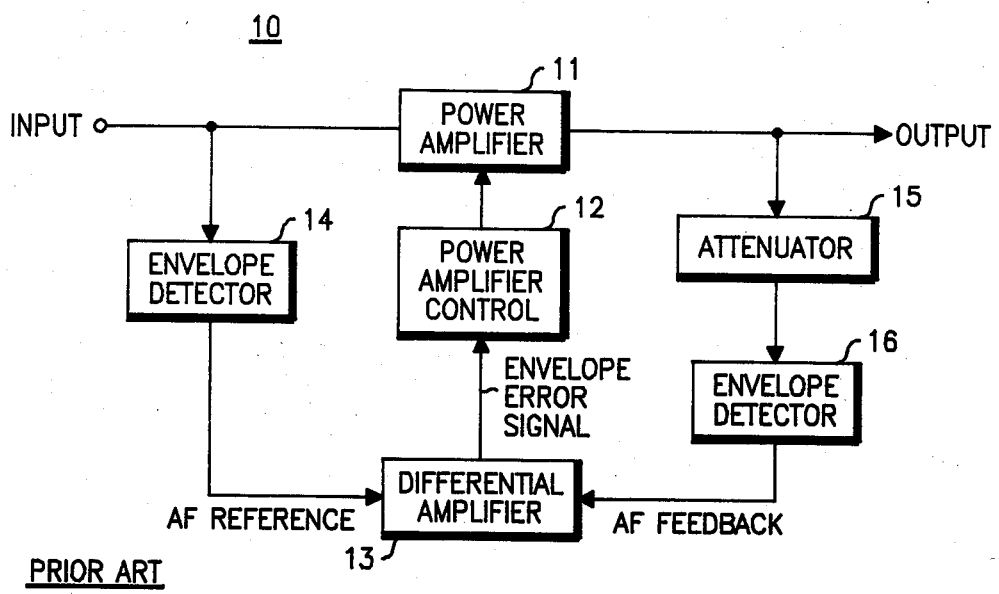
FIG. 1 is a block diagram of an envelope feedback system for a linear power amplifier in accordance with the prior art.

Referring now to the drawings, FIG. 3 generally illustrates the envelope error signal control voltage vs. time response of a linear power amplifying system, obtained by the standard two-tone modulation test for linearity. It is well known to those skilled in the art that the two-tone modulation test for linearity is comprised of two audio frequency tones (such as, for example, 1000 Hz. and 1600 Hz.) being applied simultaneously to an SSB modulator to produce the familiar two-tone envelope pattern of RF. When a signal having this envelope pattern is applied to an envelope feedback system, of the type shown in FIG. 1 or FIG. 2, an envelope error signal fed to power amplifier control 12 will appear as illustrated in FIG. 3. In the trivial case in which power amplifier 11 is perfectly linear and in which the envelope feedback loop components exhibit zero DC drift, (i.e.—the amplifying system is both linear and balanced), the envelope error signal would appear as a constant DC voltage coincident with the system reference voltage $V_R$. Thus, no error correction is required for the linear balanced system. The system reference voltage $V_R$ is the DC bias voltage applied to the power amplifier control stage 12 which corresponds to nominal operating gains of the feedback loop components. $V_R$ should maintain a highly stable reference, being both voltage regulated and temperature compensated.

Figure 2:
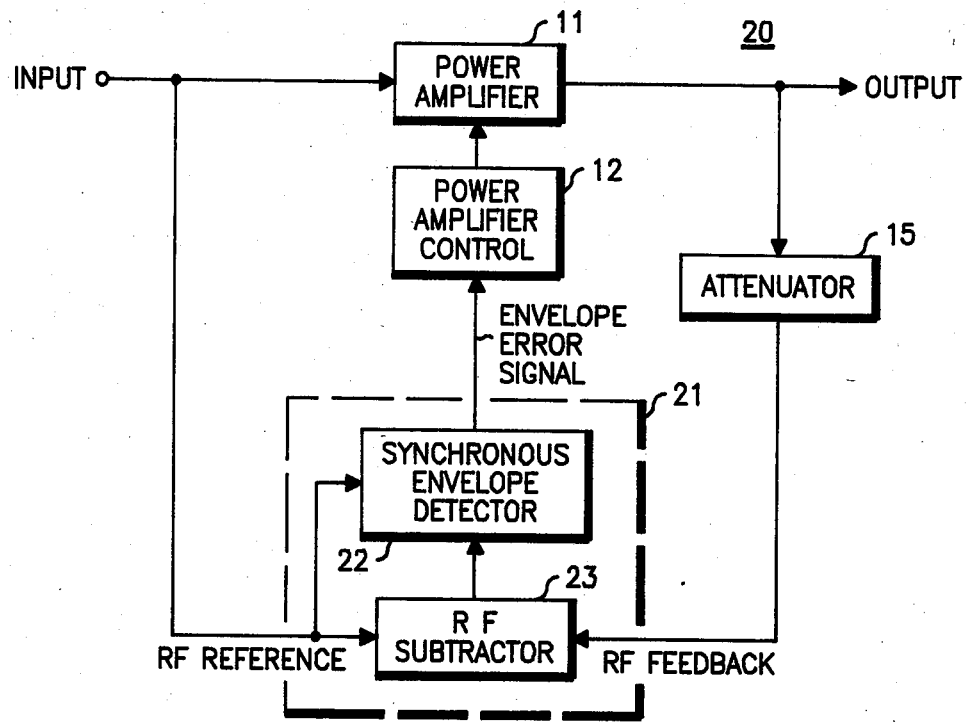
FIG. 2 is a block diagram of a known improvement to the envelope feedback system of FIG. 1.
Figure 3A:
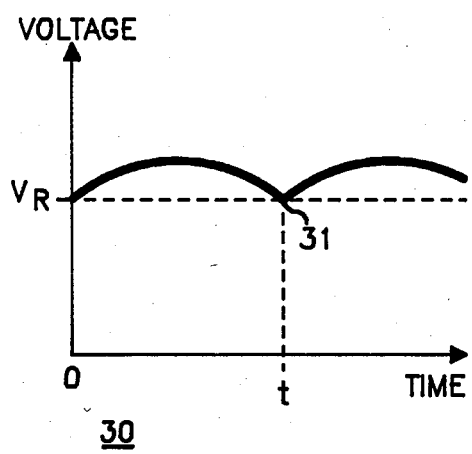
FIG. 3a is a graphic representation of error signal control voltage vs. time for a balanced envelope feedback system.

However, in the nontrivial case in which the power amplifier displays a somewhat nonlinear or "quasi-linear" transfer function, with the envelope feedback loop system remaining balanced, the envelope error signal control voltage vs. time response would exhibit AC variations around $V_R$ as shown in FIG. 3a. (The term "quasi-linear", in this instance, refers to the compression of the output signal of a class A or class AB power amplifier at very high input drive levels.) As the amplitude of the input signal envelope is reduced, the envelope feedback system as shown in FIG. 1 or FIG. 2 imposes a necessary reduction in the gain of the feedback system. When the input signal amplitude reaches a null, the feedback system gain correspondingly reaches a minimum. Since minimum (zero or near-zero) feedback loop gain simultaneously occurs at this null point, the envelope error signal control voltage also reaches a null. FIG. 3a illustrates this null point 31 occurring at time "t". In a balanced system, null point 31 corresponds to the system reference voltage $V_R$. Concurrently, the power amplifier becomes linear—therefore requiring zero error correction at tht point. Time "t" is a function of the difference frequency of the two modulating tones. (In the above example, the difference frequency would be 600 Hz., which is of a 1.66 ms. period, for which time "t" would be 0.83 ms.) Hence, the "balanced system" response 30 of FIG. 3a illustrates the balanced envelope error signal waveform for a quasi-linear power amplifying system during the two-tone modulation test.

A specific and attractive approach to the implementation of the envelope comparison mechanism 21 of FIG. 2 is the application of an active double-balanced modulator/demodulator integrated circuit device configured as a synchronous envelope detector. This approach proves desirable because this particular type of device generally exhibits excellent balance characteristics, high terminal impedances, and a conversion gain greater than unity which contributes to loop gain requirements. Furthermore, the additional benefit of low cost is obtained with this type of device. An example of such a device is the Motorola MC1496/1596 balanced modulator. Of course, there are numerous other devices available which may be readily utilized and remain within the scope of the present invention.

A problem, however, arises from the inherent requirement that DC coupling is required in the envelope feedback loop. This becomes necessary because the feedback loop response must extend to DC to correct for power amplifier compression. Therefore, the DC operating point drift of the feedback loop components must be kept to an absolute minimum. Unfortunately, active double-balanced modulator/demodulator devices display an unacceptable level of DC common-mode drift with variations of temperature and voltage. DC drift away from the system reference voltage $V_R$ creates an imbalance in the envelope feedback loop, which introduces a residual error that actually modulates the input signal. As a result, the this residual error causes the power amplifying system to exhibit poor out-of-band distortion performance.

Figure 3B:
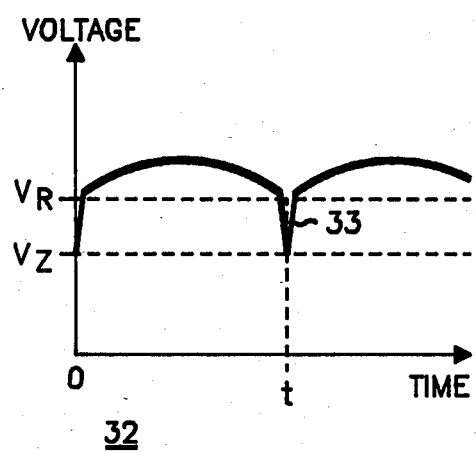
FIG. 3b is the corresponding graphic representation of error signal control voltage vs. time for an unbalanced envelope feedback system.

FIG. 3b illustrates this phenomenon. The envelope error signal control voltage vs. time response of an unbalanced, nonlinear system 32 shows a substantial difference in the instantaneous level of the control voltage at a null from the system reference voltage $V_R$. When the input signal envelope reaches a peak level—that is, when the power amplifying system is driven to near maximum output—a corresponding peak in the level of the error signal is required to track-out any power amplifier nonlinearities, assuming, of course, that there is sufficient loop gain. When the input signal envelope reaches a null (corresponding to low input drive level) at time "t", the amount of corrective feedback is reduced, thus, the envelope error signal returns to its "zero correction level". If the DC balance of the feedback loop has changed (due to a DC voltage drift in the synchronous detector), then the zero correction level voltage $V_Z$ of the envelope error signal will not correspond to the system reference voltage $V_R$. As a result, the envelope error signal control voltage must make a nearly instantaneous transition from $V_R$ to $V_Z$ and back whenever a null occurs. These high slew-rate control voltage transitions 33—from the system reference level $V_R$ to the zero signal correction level $V_Z$ (and back)—represent a mistracking of the envelope feedback loop during periods of low feedback gain corresponding to input signal nulls. These control signal impulses contain considerable harmonic energy resulting in the generation of modulation sidebands on the transmitted output signal, causing adjacent-channel interference (splatter).

Figure 4:
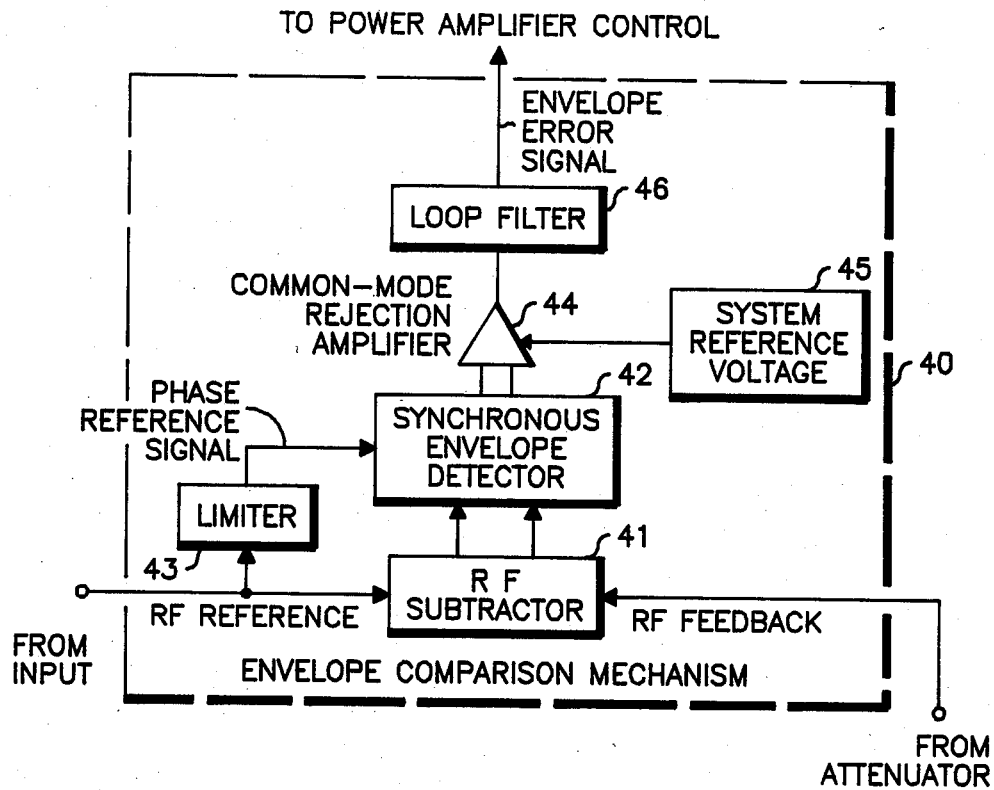
FIG. 4 is a detailed block diagram of an improved envelope comparison mechanism for an envelope feedback system.

FIG. 4 illustrates how the present invention achieves a stable operating point with the active double-balanced modulator/demodulator device, despite inherent drift mechanisms. The envelope comparison mechanism 21 of FIG. 2 is significantly improved by the addition of common-mode rejection amplifier 44 directly following synchronous envelope detector 42, as shown in FIG. 4, resulting in an envelope error signal output that displays very little variation in the presence of common-mode detector drift. RF reference signal from the system input is applied to RF subtractor 41, as well as being limited by limiter 43 and applied to synchronous envelope detector 42 as a phase reference signal. The RF feedback signal from attenuator 15 is simultaneously applied to RF subtractor 41, which, in turn, furnishes an RF difference signal to synchronous envelope detector 42. As previously mentioned, the RF feedback signal is phase-corrected to the RF reference signal by an auxiliary phase-control feedback loop, which is well known and widely used in the art. Therefore, a complete description of the auxiliary phase loop is not deemed necessary. RF subtractor 41 may be of the active type, such as, for example, a Motorola MC1733 video differential amplifier, or it may be of the passive type, such as, for example, an in-phase power splitter/combiner. The phase reference signal is necessary for synchronous detector operation. Depending on the configuration of the RF subtractor, either one (single-ended) or two (double-balanced) outputs will be fed to the detector. The balanced outputs of the detector are fed to common-mode rejection amplifier 44 which produces the "corrected" envelope error signal, substantially free of any common-mode drift. Amplifier 44 would typically consist of a balanced-input differential amplifier specifically chosen to exhibit a high common-mode rejection ratio. A particular device suitable for this application would be a Motorola MLM107/207/307 operational amplifier, which is capable of operating with inputs near the supply voltage, so as to properly interface with the synchronous envelope detector outputs. Numerous equivalent devices may also be utilized. The differential amplifier input circuitry itself is also designed for high common-mode rejection by providing, for example, low-tolerance, matched resistors as gain-setting elements. Additionally, it is important to provide proper DC terminations of the RF ports of the synchronous envelope detector, including, for example, matched, low-tolerance resistors of relatively low-values as DC returns for the outputs.

The envelope comparison mechanism 40 of FIG. 4 further includes system reference voltage 45 applied to common-mode rejection amplifier 44, which serves as a DC reference voltage $V_R$, providing a DC bias to the corrected envelope error signal. As previously mentioned, the system reference voltage $V_R$ must supply a stable operating point for the envelope feedback loop components. Therefore, $V_R$ is preferably both voltage regulated and temperature compensated.

Loop filter 46, coupled to the output of common-mode rejection amplifier 44, provides the necessary envelope feedback loop filtering of the corrected envelope error signal before it is applied to the power amplifier control stage. The loop filter typically comprises a single-pole, low-pass filter which determines the bandwidth of the envelope feedback loop. In the present embodiment, loop filter 46 consists of a single-pole active low-pass filter implemented as part of the gain-feedback network of differential amplifier 44. The loop bandwidth of the envelope feedback loop is determined by the expected modulation bandwidth and the desired distortion performance. If, for example, a nominal 3 kHz wide modulating signal is used, and it is desired that the loop correct for all signals up to and including the fifth order product, then an appropriate low-pass corner frequency would be [mod.bw.$\times$order/2 = 3 kHz$\times$5th/2] 7.5 kHz.

In summarizing the first aspect of the invention, FIG. 4 illustrates envelope comparison mechanism 40 which provides significant improvement over the prior art envelope comparison mechanism 21 of FIG. 2 by maintaining DC balance. According to the invention, an error signal correction means is provided for correcting the DC level of the envelope error signal in response to common-mode variations in the DC level output of the envelope detector. As a result, the zero correction level voltage $V_Z$ of the envelope error signal is maintained at the system reference voltage $V_R$ during input envelope nulls, resulting in a balanced envelope feedback system control voltage response, as shown in FIG. 3a.

In a linear power amplifying system, the DC balance of the envelope feedback loop is also dependent upon variations in loop gain. Any variations in gain of the individual components of the feedback loop will cause an imbalance in the entire envelope feedback system. If the gain of the forward path (including power amplifier, buffer amplifiers, up-converters, etc.) changes, or if the gain of the feedback path (attenuator and associated coupler, buffers, down-converters, etc.) changes, then the system becomes unbalanced. These gain changes may be attributed to variations in operating temperature of the power amplifier, or fluctuations in the supply voltage, or aging of the component parts in the loop. If the system is unbalanced, the envelope error signal to the power amplifier control stage will instantaneously deviate from the system reference voltage $V_R$ in response to variations in drive level as controlled by the input signal.

Figure 3C:
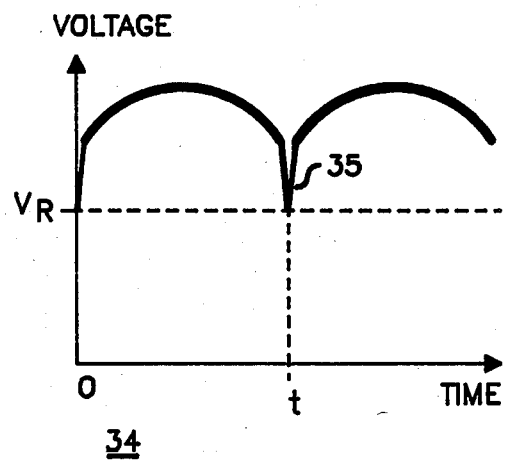
FIG. 3c is yet another graphic representation of error signal control voltage vs. time for an unbalanced system.

FIG. 3c shows the error signal control voltage vs. time response for an unbalanced system 34 caused by variations in loop gain. A decrease, for example, in the gain of any component of the feedback path creates the requirement for a corresponding increase in the gain of the forward path during peak input signal levels. This increase in forward path gain is displayed in FIG. 3c as a greater average control voltage deviation from $V_R$ than in the balanced system case. If sufficient loop gain is available, this increased error signal level will correctly track out any power amplifier nonlinearities. Conversely, during a null in the input signal level, less loop gain is required and the envelope error signal returns to its zero correction level. As mentioned previously, the zero correction level voltage $V_Z$ corresponds to the system reference voltage $V_R$ when no DC drifts are present in the system. This zero correction level, however, is substantially removed from the average loop gain level by virtue of the increased loop gain requirements. Consequently, the error signal control voltage displays a high slew rate transition 35 at time "t", similar to transition 33 of FIG. 3b. These control signal impulses contain considerable harmonic energy, and, accordingly, generate adjacent-channel distortion on the transmitter output signal.

According to the second aspect of the invention, system balance may be achieved through the implementation of an auxiliary loop gain control means providing a loop gain error signal that would correct for any deviation in loop gain response. This control means has proven particularly applicable to a linear power amplifying system that employs a power amplifier control with a gain-control input port. The preferred embodiment utilizes a voltage-controlled attenuator/modulator device, such as, for example, a Motorola 3N211 dual-gate MOSFET, which provides a first control input (gate 1) for the envelope error signal and a second control input (gate 2) for the loop gain error signal. It is to be understood, however, that the preferred embodiment suggests only one of numerous power amplifier control configurations, and, therefore, is not intended to limit the scope of the invention.

Figure 5:
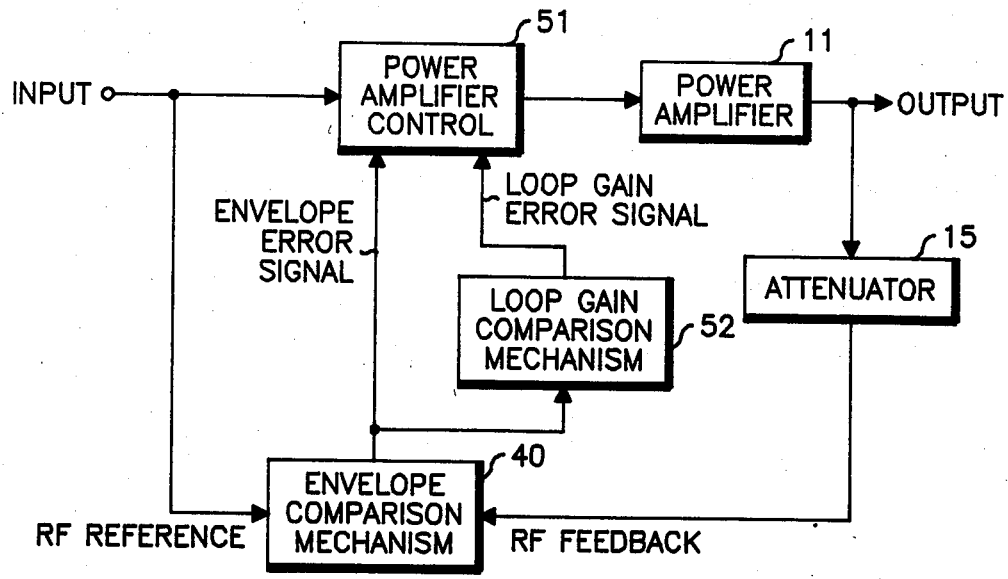
FIG. 5 is a block diagram of an improved envelope feedback system for a linear power amplifier illustrating the loop gain comparison mechanism in accordance with the present invention.

FIG. 5 illustrates the loop gain correction means of the present invention in a linear power amplifying system 50. It is to be noted that the power amplifier control stage 51 may be configured to be in cascade with power amplifier 11, as depicted in FIG. 5, or it may be configured as a control input to power amplifier 11, as shown in FIG. 1 or FIG. 2, depending upon the particular technique employed. The envelope feedback loop, including attenuator 15 and envelope comparison mechanism 40, remain substantially unchanged. Loop gain comparison mechanism 52 provides a loop gain error signal to power amplifier control 51 in response to slow variations in envelope error signal level, thereby correcting for changes in loop gain.

Figure 6:
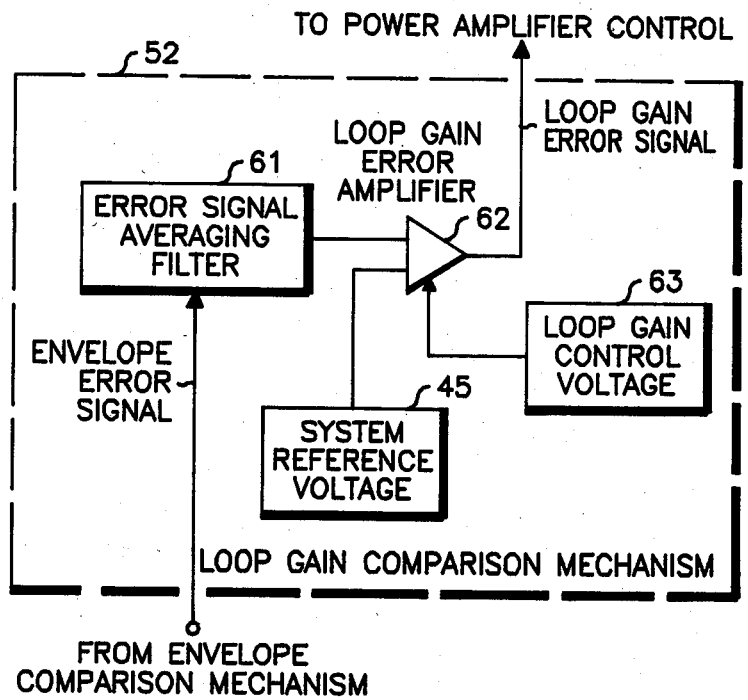
FIG. 6 is a detailed block diagram of the loop gain comparison mechanism of FIG. 5.

Referring now to FIG. 6, loop gain comparison mechanism 52 extracts an average DC level from the envelope error signal via error signal averaging filter 61, which simply consists of a single-pole, low-pass filter with a very low corner frequency, such as, for example, 3 Hz. This average DC level of the envelope error signal is fed as one input to loop gain error amplifier 62, whereby the other input is fed directly from system reference voltage 45. Loop gain error amplifier 62, comprised of a general purpose differential amplifier, such as, for example, one-half of a Motorola MC3358/3458/3558 dual operational amplifier, produces a loop gain error signal corresponding to the DC difference between the envelope error signal average level and $V_R$. The loop gain error signal is fed to the power amplifier control stage, which varies its gain (or equivalently its attenuation) to control the loop gain of the entire envelope feedback system. When the gain of the feedback loop is varied, the average DC level of the envelope error signal is correspondingly changed. Thus, through controlling the loop gain, the error signal average level can be moved toward $V_R$, and the envelope feedback system balance can be achieved. More particularly, by controlling the loop gain, the envelope error signal impulses causing residual splatter can be avoided.

Loop gain control voltage 63 is applied to loop gain error amplifier 62 as a DC bias voltage to set the nominal DC level of the loop gain error signal. Depending on the particular configuration of the power amplifier control stage, a specific DC voltage may be required to set a nominal bias voltage which would correlate to a nominal loop gain. Loop gain control voltage 63 may also include a means to adjust this nominal bias voltage, thus providing a means to initially set the system loop gain.

The loop gain comparison mechanism of FIG. 6 seeks to maintain system balance by correcting for variations in loop gain as seen by deviations in the DC level of the envelope error signal. Depending on the parameters of the particular system, a difficulty may arise if a highly nonlinear power amplifier produces a large error signal. The average value of the envelope error signal, as derived by the error signal averaging filter 61, may be sufficiently high so as to cause the auxiliary loop gain comparison mechanism to over-compensate the loop gain. This would cause the error signal to display inflections over the dynamic range of input drive signal, and possibly result in a disproportionate increase in splatter. Numerous approaches to the solution of this difficulty may be implemented, but each approach must be evaluated in terms of cost vs. performance for the particular characteristics of the envelope feedback system utilized. For example, a more complex error signal processing circuit could be devised which would prevent such inflections from reaching loop gain error amplifier 62. Another approach may include the use of a sample-and-hold mechanism, subsequently described, affixed to the output of the error amplifier to monitor the loop gain error signal. Still another approach may be to improve upon the linearity of the power amplifier itself.

One variation of the present invention, specifically applicable to a power amplifying system which exhibits the aforementioned over-compensation difficulties, is to employ a sample-and-hold mechanism between the output of loop gain error amplifier 62 and the loop gain control input of power amplifier control 51. The sample-and-hold circuit would have unity gain during the sampling interval, and be capable of holding its output level outside of that interval. The criterion for determining the sampling should be chosen to match the particular characteristics of the power amplifier. One possible criterion might be to control the sample-and-hold circuit from the error signal averaging filter, wherein the sampling would cease whenever the AC component of the envelope error signal control line exceeds a predetermined level. Thus, undesirable envelope error signal inflections—generated by highly nonlinear power amplifiers—would not cause the loop gain correction means to over-compensate.

In summarizing the second aspect of the present invention, FIG. 6 diagrams loop gain comparison mechanism 52, which provides a novel means to compensate the gain of power amplifier control 51 in response to variations in the gain of the individual feedback loop components. The envelope error signal is monitored by error signal averaging filter 61 for changes in DC level and compared to system reference voltage 45 in loop gain error amplifier 62, producing a loop gain error signal to correct for these loop gain variations. Loop gain control voltage 63 provides a means to set nominal loop gain.

Figure 7:
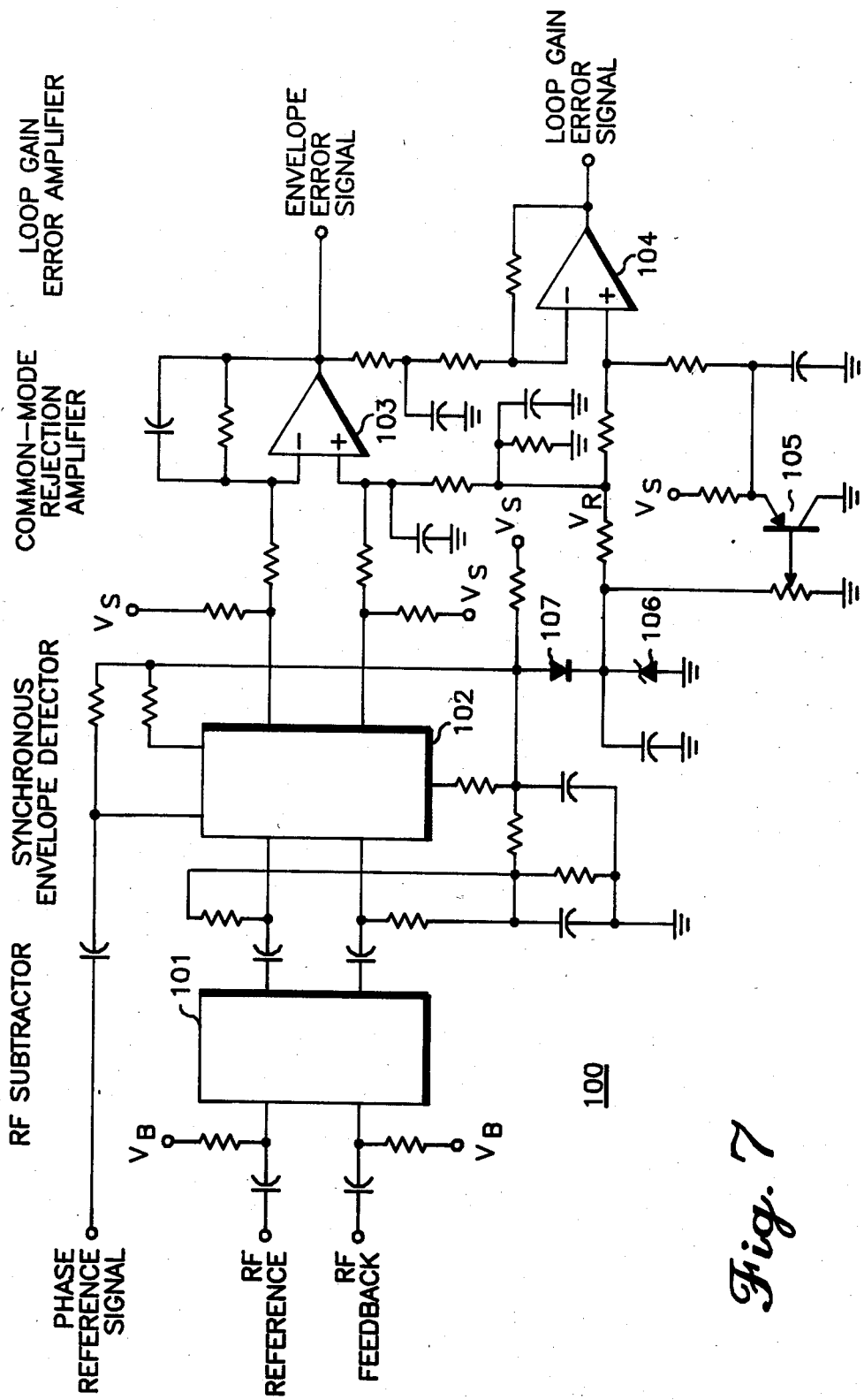
FIG. 7 is a partial schematic diagram of the preferred embodiment of the improved envelope feedback system circuitry of the present invention.

FIG. 7 illustrates the preferred embodiment of the present invention in a schematic form. Both aspects of the invention are shown in circuit diagram 100. The RF reference signal from the system input port is combined with the RF feedback signal from attenuator 15 in RF subtractor 101 (e.g. MC1733 video diff. amp.). Bias voltage $V_B$, approximately equivalent to one-half of the supply voltage $V_S$, provides an appropriate DC bias for the inputs. The balanced outputs (RF difference signal) of the RF subtractor are fed to synchronous envelope detector 102 (e.g. MC1596 balanced modulator) which employs a phase reference-signal from limiter 43. An appropriate bias voltage is derived from $V_S$ and applied to these input signals, as well as to the detector's bias current input. The balanced outputs of detector 102 are fed to common-mode rejection amplifier 103 (e.g. MLM107 op. amp.), and are biased by $V_S$ through matched, low-tolerance resistors. The system reference voltage $V_R$, derived from $V_S$, is also applied to error amplifier 103 to determine a DC level for the output envelope error signal, which is fed to the power amplifier control stage. The loop filter is comprised of a simple resistor/capacitor feedback network around amplifier 103. The envelope error signal is also averaged by the resistor/capacitor/resistor combination, comprising the error signal averaging filter, at the negative input of loop gain error amplifier 104 (e.g. MC3358 op. amp.). The system reference voltage $V_R$, in conjunction with the loop gain control voltage derived from the emitter of PNP transistor 105, is applied to the positive input. The base of transistor 105 is fed from the wiper of a variable resistor to permit a nominal loop gain adjustment. PNP transistor 105, configured as an emitter-follower, is used in this instance to provide a stable, low-impedance, temperature compensated loop gain reference voltage. The system reference voltage $V_R$ is determined by reference diode 106, which is internally temperature compensated. Series silicon diode 107 adds a one-diode temperature coefficient to $V_R$ to temperature stabilize the current source and differential input pairs of synchronous detector 102 in order to further reduce the detector's common-mode drift. It should be understood, however, that other voltage regulation or temperature compensation schemes may be utilized to provide the same result.

In summary, the present invention provides an improvement to a linear power amplifying system that maintains DC balance of the feedback loop under adverse conditions, thereby reducing power amplifier nonlinearities. The improvement is realized through the addition of two differential amplifier stages to the envelope feedback loop. The first differential amplifier serves to correct the common-mode DC drift of the synchronous envelope detector. The second differential amplifier serves to correct for any gain changes in the individual components of the feedback loop. The improvement provides envelope modulation transmitters with a substantial reduction in adjacent-channel interference and lower on-channel distortion.

While only particular embodiments of the invention have been shown and described herein, it will be obvious that certain modifications may be made without departing from the invention in its broader aspects and, accordingly, the appended claims are intended to cover all such changes and alternative constructions that fall within the true scope and spirit of the invention.

What is claimed is:

1. A linear power amplifier feedback system for amplifying amplitude modulated radio frequency (RF) signals, said feedback system comprising:
power amplifier means for amplifying RF signals; said power amplifier means having its input coupled to a system input port for receiving the RF signal to be amplified and having its output coupled to a system output port at which the amplified RF signal is to be provided;

power amplifier control means coupled to said power amplifier means for controlling the amplitude of the output RF signal of said power amplifier means in response to an envelope error signal;

attenuator means coupled to said system output port for producing an attenuated output RF signal;

RF combining means for linearly combining the input RF signal at said system input port and said attenuated output RF signal thereby producing an RF difference signal;

envelope detection means for detecting the amplitude of said RF difference signal thereby producing said envelope error signal coupled to said power amplifier control means;

error signal correction means for correcting the DC level of said envelope error signal in response to variations in DC level output of said envelope detection means thereby maintaining DC balance of said linear power amplifier feedback system.

2. The linear power amplifier feedback system according to claim 1, wherein said envelope detection means includes a synchronous envelope detector being further comprised of an active balanced modulator/demodulator having a pair of balanced outputs.

3. The linear power amplifier feedback system according to claim 2, wherein said error signal correction means comprises a first differential amplifier having each of two inputs connected to each of said pair of balanced outputs of said synchronous envelope detector and configured to reject common-mode signals from said synchronous envelope detector thereby producing a corrected envelope error signal output to said power amplifier control means.

4. The linear power amplifier feedback system according to claim 3, wherein said error signal correction means further comprises a first low-pass filter coupled to said first differential amplifier output thereby providing loop filtering for said corrected envelope error signal.

5. The linear power amplifier feedback system according to claim 3, wherein said error signal correction means further comprises a DC reference voltage applied to said first differential amplifier thereby providing a stable DC bias for said corrected envelope error signal.

6. The linear power amplifier feedback system according to claim 5, wherein said DC reference voltage is temperature compensated.

7. The linear power amplifier feedback system according to claim 1, wherein the feedback system further comprises:

loop gain correction means coupled to said power amplifier control means for correcting the gain of said feedback system providing a loop gain error signal responsive to variations in average DC level of said envelope error signal thereby maintaining loop balance of said linear power amplifier feedback system.

8. The linear power amplifier feedback system according to claim 7, wherein said loop gain correction means comprises a second differential amplifier having a first input coupled to said envelope error signal and having a second input connected to a DC reference voltage thereby providing a loop gain error signal output to said power amplifier control means.

9. A linear power amplifier feedback system for amplifying amplitude modulated radio frequency (RF) signals, said feedback system comprising:

power amplifier means for amplifying RF signals; said power amplifier means having its input coupled to a system input port for receiving the RF signal to be amplified and having its output coupled to a system output port at which the amplified RF signal is to be provided;

power amplifier control means coupled to said power amplifier means for controlling the amplitude of the output RF signal of said power amplifier means in response to an envelope error signal and for controlling the loop gain of said feedback system in response to a loop gain error signal;

attenuator means coupled to said system output port for producing an attenuated output RF signal;

RF combining means for linearly combining the input RF signal at said system input port and said attenuated output RF signal thereby producing an RF difference signal;

envelope detection means for detecting the amplitude of said RF difference signal thereby producing said envelope error signal coupled to said power amplifier control means;

loop gain correction means for correcting the gain of said feedback system providing said loop gain error signal responsive to variations in average DC level of said envelope error signal thereby maintaining loop balance of said linear power amplifier feedback system.

10. The linear power amplifier feedback system according to claim 9, wherein said loop gain correction means comprises a second differential amplifier having a first input coupled to said envelope error signal and having a second input connected to a DC reference voltage thereby providing a loop gain error signal output to said power amplifier control means.

11. The linear power amplifier feedback system according to claim 10, wherein said DC reference voltage is temperature compensated.

12. The linear power amplifier feedback system according to claim 9, wherein said loop gain correction means further comprises a second low-pass filter coupled to said second differential amplifier first input thereby providing an average DC level of said envelope error signal.

13. The linear power amplifier feedback system according to claim 9, wherein said loop gain correction means further comprises a loop gain control voltage applied to said second differential amplifier thereby providing means to determine nominal loop gain.

14. The linear power amplifier feedback system according to claim 13, wherein said loop gain control voltage is temperature compensated.

15. The linear power amplifier feedback system according to claim 9, wherein said loop gain correction means further comprises a sample-and-hold means coupled to the output of said second differential amplifier thereby providing a gated sample of said loop gain error signal to said power amplifier control means.

16. The linear power amplifier feedback system according to claim 9, wherein said envelope detection means includes a synchronous envelope detector being further comprised of an active balanced modulator/demodulator having a pair of balanced outputs.

17. The linear power amplifier feedback system according to claim 16, wherein the feedback system further comprises:
  error signal correction means for correcting the DC level of said envelope error signal in response to variations in DC level output of said envelope detection means thereby maintaining DC balance of said linear power amplifier feedback system.

18. The linear power amplifier feedback system according to claim 17, wherein said error signal correction means comprises a first differential amplifier having each of two inputs connected to each of said pair of balanced outputs of said synchronous envelope detector and configured to reject common-mode signals from said synchronous envelope detector thereby producing a corrected envelope error signal output to said power amplifier control means.

19. In a linear power amplifier feedback system for amplifying amplitude modulated radio frequency (RF) signals which includes:
  power amplifier means for amplifying RF signals; said power amplifier means having its input coupled to a system input port for receiving the RF signal to be amplified and having its output coupled to a system output port at which the amplified RF signal is to be provided;
  power amplifier control means coupled to said power amplifier means for controlling the amplitude of the output RF signal of said power amplifier means in response to an envelope error signal;
  attenuator means coupled to said system output port for producing an attenuated output RF signal; the improved feedback arrangement comprising:
  RF combining means for linearly combining the input RF signal at said system input port and said attenuated output RF signal thereby producing an RF difference signal;
  synchronous envelope detection means for detecting the amplitude of said RF difference signal thereby producing said envelope error signal coupled to said power amplifier control means;
  error signal correction means for correcting the DC level of said envelope error signal in response to variations in DC level output of said synchronous envelope detection means thereby maintaining DC balance of said linear power amplifier feedback system; and
  loop gain correction means for correcting the loop gain of said feedback system in response to variations in average DC level of said envelope error signal thereby maintaining loop balance of said linear power amplifier feedback system.

20. The improved feedback system according to claim 19, wherein said synchronous envelope detector is further comprised of an active balanced modulator/demodulator having a pair of balanced outputs.

21. The improved feedback system according to claim 20, wherein said error signal correction means comprises a first differential amplifier having each of two inputs connected to each of said pair of balanced outputs of said synchronous envelope detector and configured to reject common-mode signals from said synchronous envelope detector thereby producing a corrected envelope error signal output to said power amplifier control means.

22. The improved feedback system according to claim 21, wherein said error signal correction means further comprises a first low-pass filter coupled to said first differential amplifier output thereby providing loop filtering for said corrected envelope error signal.

23. The improved feedback system according to claim 21, wherein said error signal correction means further comprises a DC reference voltage applied to said first differential amplifier thereby providing a stable DC bias for said corrected envelope error signal.

24. The improved feedback system according to claim 23, wherein said DC reference voltage is temperature compensated.

25. The improved feedback system according to claim 19, wherein said loop gain correction means comprises a second differential amplifier having a first input coupled to said envelope error signal and having a second input connected to a DC reference voltage thereby providing a loop gain error signal output to said power amplifier control means.

26. The improved feedback system according to claim 25, wherein said DC reference voltage is temperature compensated.

27. The improved feedback system according to claim 25, wherein said loop gain correction means further comprises a second low-pass filter coupled to said second differential amplifier first input thereby providing an average DC level of said envelope error signal.

28. The improved feedback system according to claim 25, wherein said loop gain correction means further comprises a loop gain control voltage applied to said second differential amplifier thereby providing means to determine nominal loop gain.

29. The improved feedback system according to claim 28, wherein said loop gain control voltage is temperature compensated.

30. The improved feedback system according to claim 25, wherein said loop gain correction means further comprises a sample-and-hold means coupled to the output of said second differential amplifier thereby providing a gated sample of said loop gain error signal to said power amplifier control means.

31. The method of generating corrective feedback for a linear power amplifier feedback system which amplifies amplitude modulated radio frequency (RF) signals comprising the steps of:
  amplifying RF signals in a power amplifier having its input coupled to a system input port for receiving the RF signal to be amplified and having its output coupled to a system output port at which the amplified RF signal is to be provided;
  controlling the amplitude of the output RF signal of said power amplifier in response to an envelope error signal;
  sampling the output RF signal at said system output port thereby producing an attenuated output RF signal;
  combining the input RF signal at said system input port and said attenuated output RF signal thereby producing an RF difference signal;
  detecting the amplitude of said RF difference signal in a synchronous envelope detector thereby producing said envelope error signal;
  correcting the DC level of said envelope error signal in response to variations in DC level output of said synchronous envelope detector thereby maintaining DC balance of said linear power amplifier feedback system; and
  correcting the loop gain of said feedback system in response to variations in average DC level of said envelope error signal thereby maintaining loop balance of said linear power amplifier feedback system.

* * * * *